United States Patent [19]

Danby et al.

[11] Patent Number: 5,061,897
[45] Date of Patent: Oct. 29, 1991

[54] EDDY CURRENT CONTROL IN MAGNETIC RESONANCE IMAGING

[75] Inventors: Gordon T. Danby, Wading River; Hank C. H. Hsieh, Ronkonkoma, both of N.Y.

[73] Assignee: FONAR Corporation, Melville, N.Y.

[21] Appl. No.: 498,342

[22] Filed: Mar. 23, 1990

[51] Int. Cl.$^5$ ............................................. G01R 33/20
[52] U.S. Cl. ..................................... 324/318; 324/319
[58] Field of Search ............... 324/300, 307, 309, 318, 324/319, 320, 322; 335/216, 298; 128/653.4

[56] References Cited

U.S. PATENT DOCUMENTS

| | | | |
|---|---|---|---|
| 4,656,447 | 4/1987 | Keim et al. | 324/320 |
| 4,673,882 | 6/1987 | Buford | 324/320 |
| 4,682,111 | 7/1987 | Hughes | 324/320 |
| 4,935,545 | 6/1990 | Chaillout et al. | 324/318 |

Primary Examiner—Michael J. Tokar
Attorney, Agent, or Firm—Lerner, David, Littenberg, Krumholz & Mentlik

[57] ABSTRACT

A medical NMR scanner having a primary field magnet assembly is disclosed. The scanner includes a ferromagnetic frame defining a patient-receiving space adapted to receive a human body. It also includes a pair of opposed polar regions aligned on a polar axis. The polar regions are disposed on opposite sides of the patient-receiving space. Structure including either electrical windings or a permanent magnet is provided in each of the polar regions for producing a magnetic field within the patient-receiving space. Windings positioned in proximity to each of the polar regions are provided for producing gradients in the magnetic field, when energized. A layer of an electrically resistive but magnetically permeable material such as a ferrite, a sintered metal or a metal containing composite, is positioned in each of the polar regions for limiting eddy current generation in the polar regions when the gradient producing auxiliary coils are energized. Each of the ferrite layers is oriented generally perpendicular to the polar axis.

27 Claims, 7 Drawing Sheets

EDDY CURRENT CONTROL IN MAGNETIC RESONANCE IMAGING

BACKGROUND OF THE INVENTION

The present invention pertains to nuclear magnetic resonance scanners, and, more particularly, to the structures employed in providing magnetic fields.

Since the invention of the medical nuclear magnetic resonance (NMR) scanning technique by Dr. Raymond Damadian, as set forth in U.S. Pat. No. 3,789,832, this technique has been widely adopted in the medical arts. Medical NMR scanning requires creation of a substantial constant "primary" magnetic field passing through the patient's body. Additional "gradient" magnetic fields varying with time typically are superimposed on the primary field. The patient is exposed to radio frequency electromagnetic waves which also vary with time in particular patterns. Under the influence of the magnetic fields and the radio waves, certain atomic nuclei within the patient's tissues resonate and emit further radio waves. By mathematical techniques involving correlation of the magnetic field patterns in use at various times with the radio frequency waves emitted, it is possible to determine the amount and/or physical state of particular atomic nuclei, or a physical condition at various locations within the patient's body. This information may be displayed as spectral data, but typically is displayed as an image with shadings corresponding to the concentration and/or physical state of certain nuclei of interest. The concentrations or physical state of different substances ordinarily differ for differing kinds of tissues. Thus, the image created by NMR techniques permits the physician to see organs and soft tissues within the body, and also permits the physician to see abnormalities, such as tumors, within the body. Accordingly, NMR scanning and imaging techniques are being adopted rapidly by physicians.

Medical NMR scanning imposes certain challenging technical requirements for the apparatus. The primary magnetic field must be a strong field, and may be from about 1 kilogauss or less to about 10 kilogauss (1 Tesla) or more. Such fields are far stronger than the magnetic fields associated with many common magnets. Moreover, the primary magnetic field must be precisely configured. Thus, the primary field, before application of the gradient fields, should be uniform to at least about 1 part in 1,000 and preferably at least about 1 part in 10,000 or better, in order to provide a useful image. Even better uniformity is more desirable. This strong uniform primary magnetic field must be maintained over a substantial scanning volume, large enough to encompass a substantial region of the patient's body so that the image will provide medically useful information. Typically, the scanning volume encompasses a major portion of the patient's torso. Further, the magnetic field apparatus typically must be arranged to receive the patient's body, and hence must provide openings large enough for the patient's body to fit within the apparatus. All these requirements, taken together, pose a formidable technical problem.

Two distinct and fundamentally different approaches to these requirements are currently employed in construction of medical NMR scanners. As set forth in commonly assigned U.S. Pat. No. 4,675,609 to Danby et al., magnetic field producing means such as permanent magnets or electromagnets can be combined with a ferromagnetic metal frame and other components to form a magnetic assembly which provides the primary field. The disclosure of said U.S. Pat. No. 4,675,609 is hereby incorporated by reference herein. Medical NMR scanners incorporating magnetic assemblies according to U.S. Pat. No. 4,675,609 have excellent primary fields and hence offer good scanning capabilities.

Electromagnets having either ordinary conductive windings or superconducting windings can also be employed. The windings of a superconducting magnet under appropriate temperature conditions lose resistance to flow of electric current. Thus, superconducting magnets can carry large currents and can create high fields. Some superconducting electromagnets have been built as essentially air core solenoids, with only minor ferromagnetic elements. As set forth in commonly assigned U.S. Pat. No. 4,766,378 to Danby et al., superior superconducting magnets for NMR scanners can be made using a ferromagnetic frame to direct the flux into the patient-receiving space to shape the magnetic field and to provide a flux return path.

As indicated earlier, and as may be seen in the aforesaid commonly assigned U.S. Pat. No. 4,766,378, gradient coils are used to superimpose gradient magnetic fields on the primary field generated by the primary field generating apparatus, such as primary windings or permanent magnets. The gradient coils are disposed within the primary field adjacent the assembly patient-receiving space. The available space within the primary field assembly is limited, because large openings tend to reduce the strength of the primary field. To provide a patient-receiving space of adequate size, the gradient coils ordinarily are disposed in proximity to the electrically conductive materials of the primary magnetic field assembly. For example, where the primary field assembly includes a ferromagnetic frame having pole pieces, the gradient coils may be disposed adjacent to the pole pieces. It is typically desirable in NMR scanning to vary the gradient fields imposed by the gradient coils at relatively rapid rates. This results in the creation of eddy currents in the ferromagnetic materials, which in turn cause undesirable disturbances in the magnetic field. The aforementioned '378 patent discloses certain magnet configurations which provide enhanced clearance within the frame, and hence allow increased distance between the gradient coils and the conductive materials.

Despite these improvements there has been a significant need heretofore for further improvement in magnetic fields of medical NMR scanners by reducing the disturbances introduced therein due to gradient-coil-induced eddy currents.

SUMMARY OF THE INVENTION

The present invention provides NMR scanners which meet those needs.

One aspect of the present invention provides a NMR scanner such as a medical NMR scanner having a primary field magnet assembly including a frame that defines a sample-receiving space such as a patient-receiving space. The frame includes a pair of opposed polar regions aligned on a polar axis and disposed on opposite sides of the patient-receiving space. The primary field magnet assembly also includes means for producing a magnetic field within the sample-receiving space by directing at least a portion of the flux through the polar regions of the frame. It is also provided with means including at least one winding positioned in proximity to each of the polar regions for producing gradients in the magnetic field when energized; and, means including a layer of magnetically permeable but electrically resistive material positioned in each of the polar regions, generally perpendicular to the polar axis, for limiting eddy current generation in the polar regions when the gradient producing means is energized. Because the layer conducts magnetic flux, it serves essentially the same function as a solid ferromagnetic component with respect to the constant, primary field. However, since it does not effectively conduct electrical currents, it effectively inhibits formation of eddy currents in the polar regions. As will be appreciated, magnetic permeability and electrical resistivity are matters of degrees. As used in this disclosure, however, the term "magnetically permeable" should be understood as referring to a permeability of at least about 1,000, and the term "electrically resistive" should be understood as referring to resistivity of at least about $10^{-3}$ ohm-cm. Stated another way, the material in the layer desirably has a permeability of at least about 0.5 times the permeability of pure iron, and a volume electrical resistivity at least about 100 times that of pure iron. Higher values of electrical resistivity and magnetic permeability are even more desirable. As further discussed below, the material in the layer desirably has a high maximum flux density, typically about 2 kilogauss and desirably higher still, and also has a relatively low coercive force, preferably below about 0.2 oersted.

The material in the layer may be a ferrite or an alloy of a class further discussed below. Alternatively, the material in the layer may be a particular material, desirably fused into a mass as by sintering or similar techniques, or else be a composite material incorporating two or more distinct phases.

As further discussed below, the layer desirably is interposed between such gradient-producing winding and the frame. The frame of the primary field magnet may be comprised of ferromagnetic material, typically iron, and may include a substantially continuous ferromagnetic flux return path extending between the polar regions remote from the patient-receiving space. The layers may be interposed between the gradient-producing winding and the frame. Desirably, the layers have sufficiently low magnetic reluctance that at least the major portion of the magnetic flux emanating from the gradient windings on the sides of the gradient windings facing the polar regions of the frame passes through the layers rather than through the frame. Stated another way, the layers most preferably isolate the frame from the flux generated by the gradient coils, and hence inhibit eddy current generation in the frame.

The foregoing features serve to substantially suppress magnetic field disturbances caused by operation of the gradient windings. This enhances the quality of and the speed of scanning. The present invention thus offers considerable improvement in NMR scanning apparatus, and particularly in the medical NMR scanning apparatus.

These and other objects, features and advantages of the present invention will be more readily apparent from the detailed description of the preferred embodiments set forth below, taken in conjunction with the accompanying drawings.

DETAILED DESCRIPTION OF THE PREFERRED EMBODIMENTS

Figure 1:
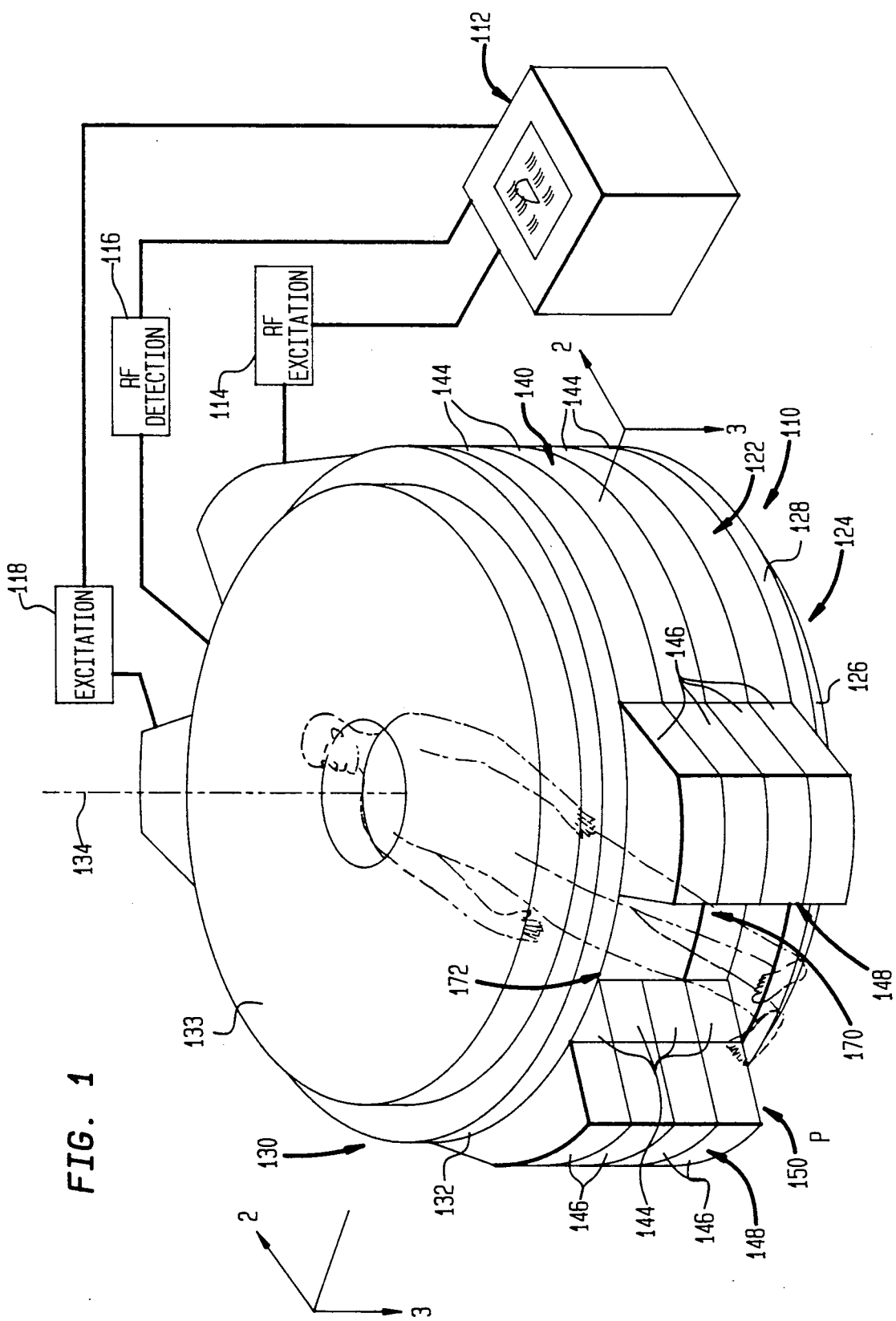
FIG. 1 is a schematic perspective view of apparatus according to one embodiment of the present invention, with some components thereof shown in block form.

Referring to the figures, a nuclear magnetic resonance scanner according to one aspect of the present invention includes a primary field magnet assembly 110 and a conventional control, computing and image display unit 112 (FIG. 1). The apparatus also incorporates conventional RF excitation and RF detection units 114 and 116 which are linked to control unit 112. Also, conventional gradient coil excitation means 118 are linked to control unit 112 and to gradient field coils 120 (FIG. 2) disposed within the primary field magnet assembly 110.

One type of primary field magnet assembly 110 includes a frame 122 formed from a "magnetically soft" ferromagnetic material. As utilized herein the term "magnetically soft" refers to a material which can be readily magnetized, i.e., a material of low coercive force. The term "ferromagnetic", as used herein, is intended to include ferrimagnetic materials as well as ferromagnetic materials. Low carbon steel is the preferred material for the frame and is employed for all components of frame 122 unless otherwise indicated below. The frame includes a lower end piece 124 comprising a ring-like bottom plate 126 and a circular top plate 128, and a similar upper end piece 130 comprising a circular lower plate 132 and an upper ring-like plate 133. All of these plates are substantially coaxial with one another, so that end pieces 124 and 130 are aligned with one another on a vertical polar axis 134. The end pieces are substantially parallel with one another.

Frame 122 includes a ferromagnetic lower pole piece 162 that projects axially inwardly, from the lower end piece 124 towards a medial plane 135. As used in this disclosure, the terms "axially inwardly" and "inboard" refer to directions parallel to the polar axis, toward the medial plane, and the term "transverse" refers to directions generally perpendicular to the polar axis. The lower pole piece 162 terminates at a lower pole face 163 relatively close to the patient receiving space 158. Lower pole piece 162 can have a generally frustoconical lower pole stem 164, a generally cylindrical pole facing piece 165 and a lower shim ring 159 covering the peripheral portion of lower pole face 163.

The upper end piece 130 is provided with a similar upper pole piece 166 including a frustoconical upper pole stem 167, a cylindrical upper pole facing piece 168, an upper pole face 169, and an upper shim ring 171. The end faces 163 and 169 and shim rings 159 and 171 cooperatively define the opposed polar regions 170 and 172 surrounding the polar axis 134 and facing toward one another. The polar regions 170 and 172 cooperatively define the theoretical medial plane 135 equidistant between them. Medial plane 135 is also equidistant between end pieces 124 and 130. The term center point"refers to the point 137 at the intersection of the polar axis and the medial plane. The pole faces 163 and 169 of the ferromagnetic frame are, thus, closely juxtaposed with the patient-receiving space 158 and with the center point 137.

Figure 2:
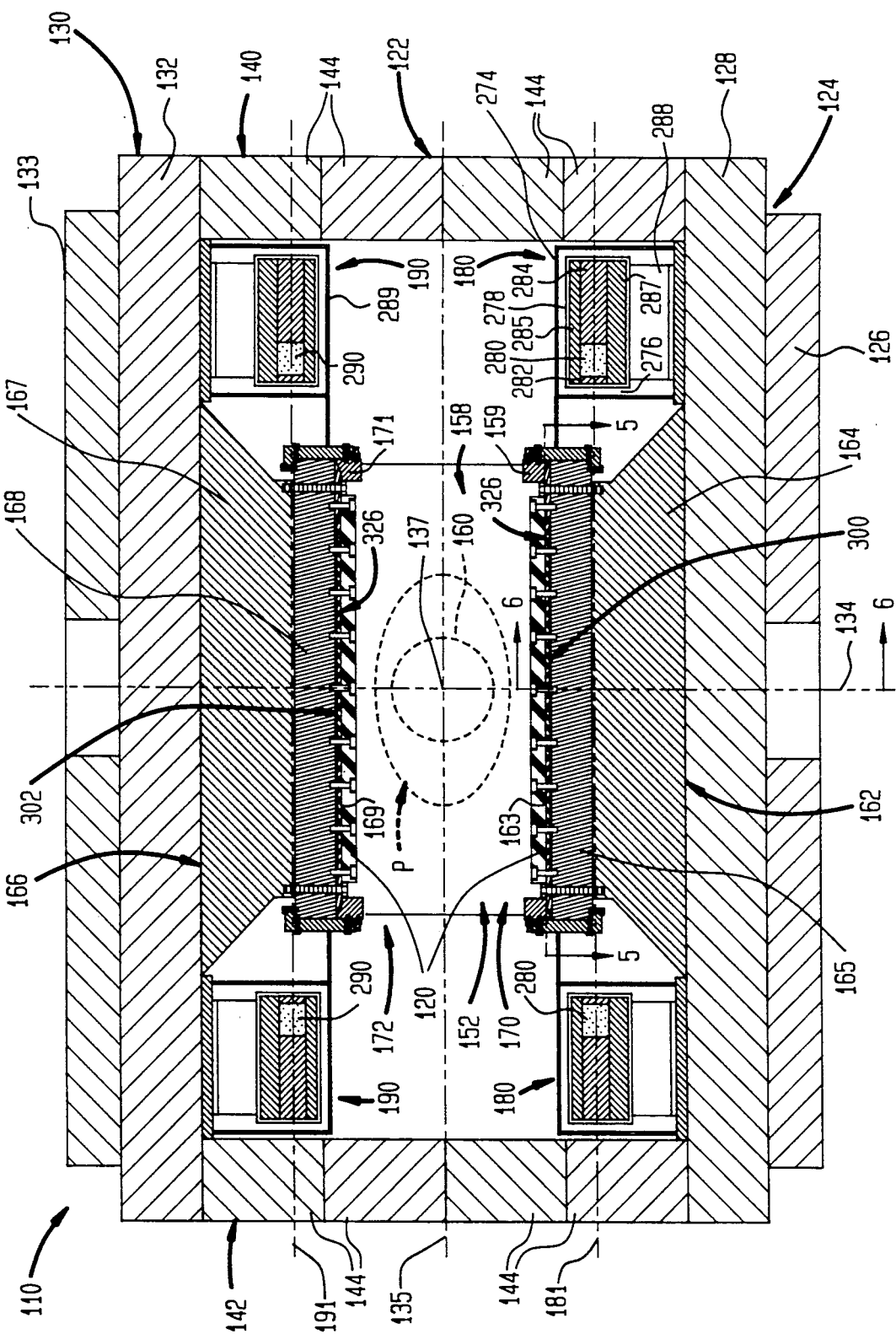
FIG. 2 is a schematic sectional elevation view, taken along the line 2—2 in FIG. 1.

Top end piece 130 of the frame is supported above bottom end piece 124 thereof by axial connectors 140 and 142, which form part of the frame and substantially encompass the patient-receiving space 158, except for patient entry openings 152, of which only one is visible in FIG. 2. Each axial connector is generally in the form of a segment of a right circular cylinder coaxial with polar axis 134. Each of these axial connectors includes four superposed sectors 144. Each of the sectors 144 is provided with a pair of projections 146 extending outwardly, away from one another at opposite ends of the sector. These projections 146 are superposed on one another and form columns 148 extending parallel to polar axis 134 at the edges of the axial connectors 140 and 142.

Figure 3:
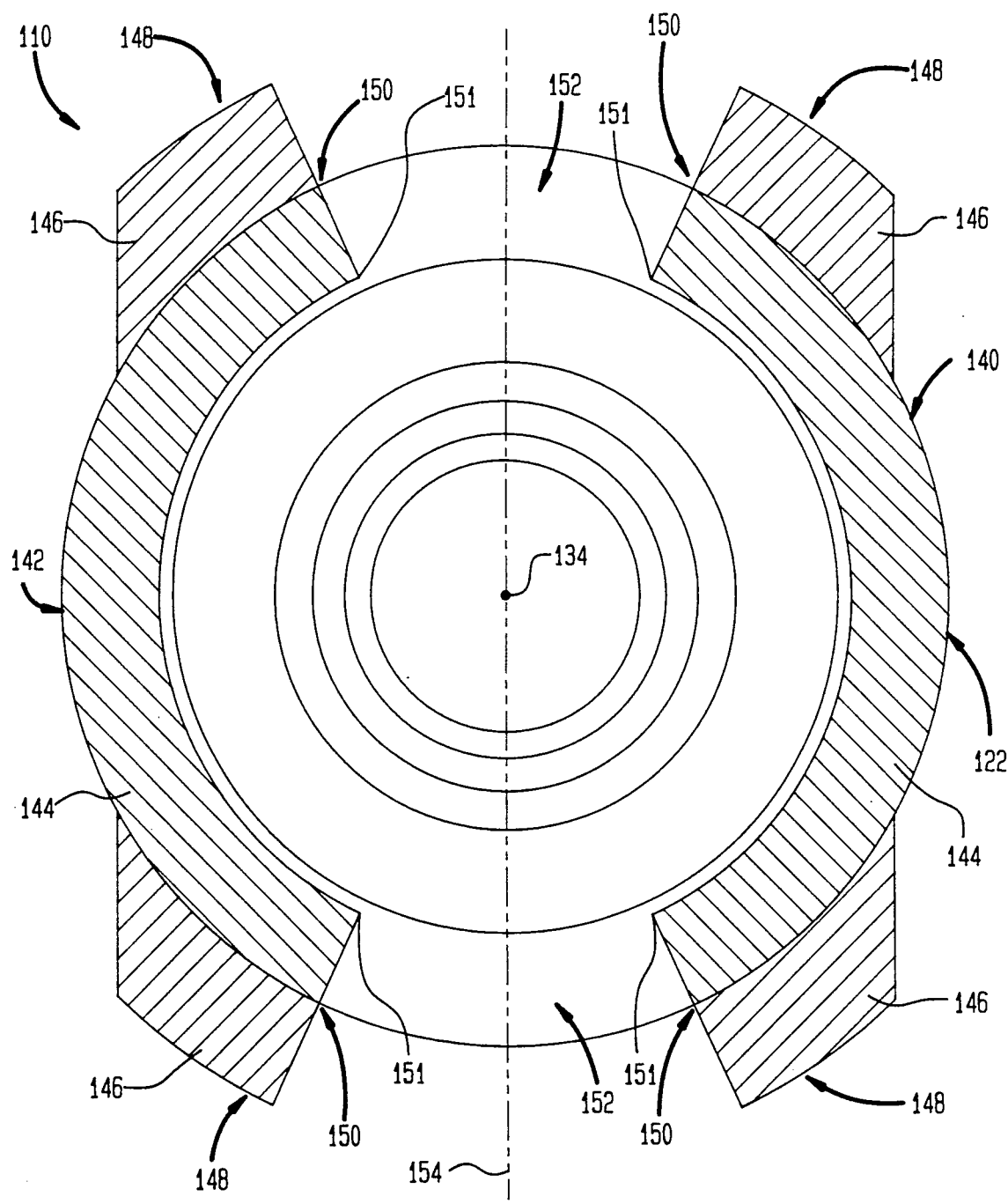
FIG. 3 is a schematic sectional plan view, taken along the line 3—3 in FIG. 1.
Figure 4:
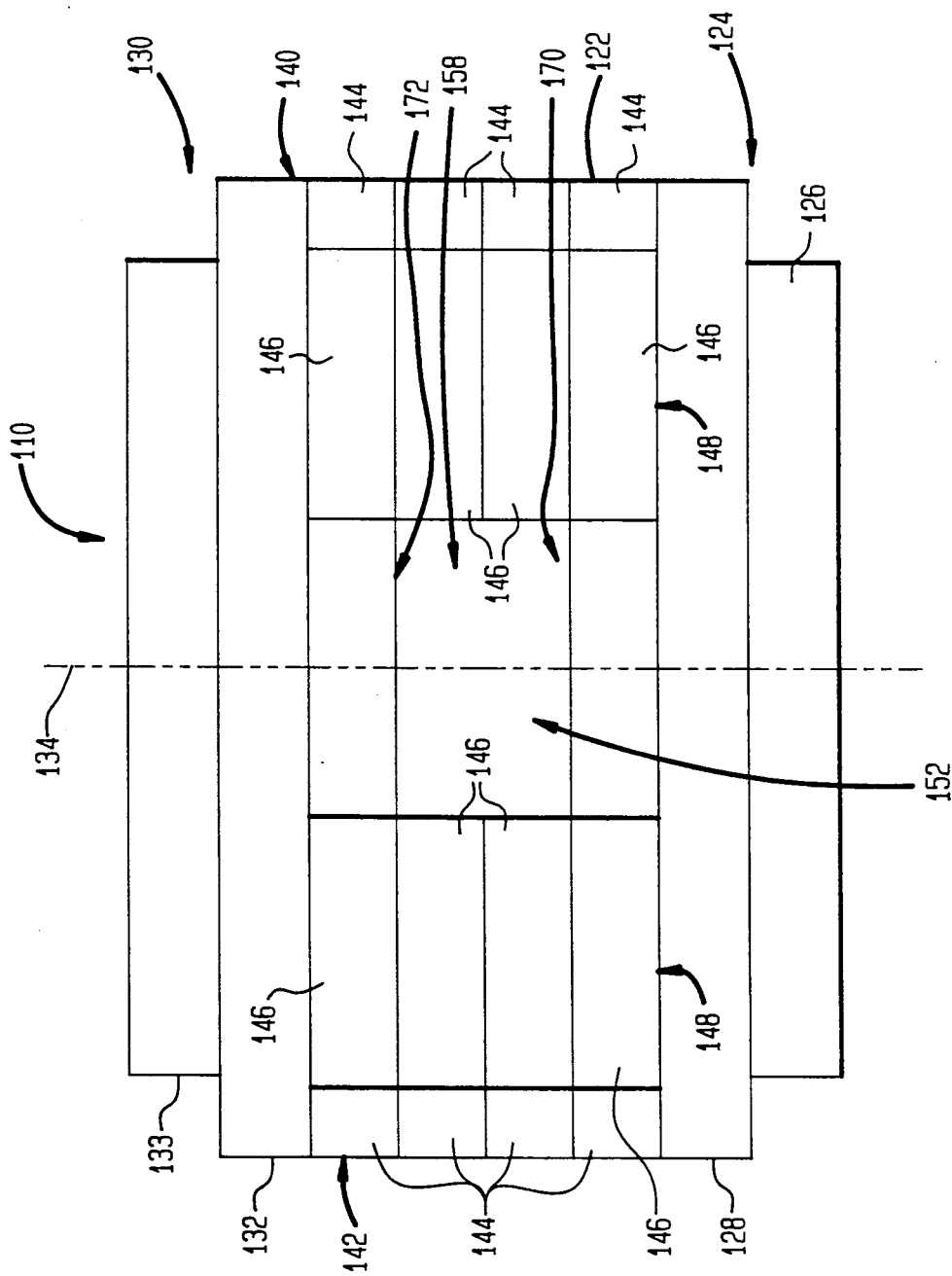
FIG. 4 is a schematic elevational view of the apparatus shown in FIGS. 1-3.

As best seen in FIGS. 1 and 3, the edges of the individual sectors 144 and projections 146 are bevelled so that the faces of the sector rings 144 and projections 146 cooperatively define generally planar surfaces 150 at the edges of axial connectors 140 and 142, these planar faces extending along substantially radial planes with respect to polar axis 134. The edges 151 of planar faces 150 closest to polar axis 134 define a pair of patient entry openings 152 leading from the outside of the frame to the space between end pieces 124 and 130. These openings are aligned with one another along a patient entry axis 154 orthogonal to polar axis 134. Openings 152 are of sufficient size for the body, i.e., the torso of a normal human adult, to be inserted therethrough. Appropriate means, preferably including a non-metallic, non-magnetic bed (not shown) are provided for positioning a patient P via the openings, so that the patient's body is positioned in the patient-receiving space 158 (FIG. 2) between polar regions 170 and 172. A particular region of the patient's body to be scanned preferably is positioned within a predetermined scanning volume 160, which is a subregion of patient-receiving space 158 surrounding center point 137.

The primary field magnet assembly 110 also includes a lower superconducting coil assembly 180 and an upper superconducting coil assembly 190. Lower coil assembly 180 includes a toroidal, vacuum-tight container or cryostat vessel 274 formed from aluminum or another non-magnetic metal, insulation 276 disposed within vessel 274 and a liquid helium container 278 disposed within insulation 276. A coil 280 of conventional superconductive wire is mounted within liquid helium container 278. Coil 280 is generally loop-like and circular and defines an axis coincident with polar axis 134 and a coil plane 181 parallel to the medial plane 135. As used in this disclosure, the term "coil plane" refers to the central plane of the coil, i.e., to the plane perpendicular to the axis of the coil, bisecting the coil.

An inner anti-buckling ring 282 is mounted within coil 280, and an outer clamping ring 284 encircles the coil, rings 282 and 284 also being concentric with polar axis 134. Coil 280 and rings 282 and 284 are supported within helium container 278 by a plastic washer (not shown) bearing on the coil and a pair of solid stainless steel support rings 285 and 287. The liquid helium container 278 closely surrounds the assembly comprising elements 280, 282, 284, 285 and 287, the liquid helium container being disposed within the insulation 276 positioned internally of the vacuum vessel 274. The liquid helium container is supported within the vacuum container 274 by coil support legs 288 which penetrate through insulation 276. A plurality of coil support legs 288 are placed on the periphery of this toroidal assembly. These legs are arranged to accommodate shrinkage of the coil and rings which occurs when the coil and rings are cooled. Appropriate means (not shown) are provided for feeding current to coil 280, and for feeding liquid helium into the liquid helium container and evacuating the interior of vessel 274. Thus, vessel 274 and the associated components serve as cryostat means for maintaining coil 280 at the low temperatures, close to absolute zero, below the critical temperature of the superconducting material in coil 280, where the material of the coil exhibits superconductivity.

Upper coil assembly 190 is of substantially the same construction as the lower coil assembly. Thus, the superconductive coil 290 of upper coil assembly 190 likewise has a coil axis coincident with polar axis 134, and a coil plane 191. The upper coil assembly also includes support and insulating structure as described, including a toroidal cryostat vessel 289. Coils 280 and 290 are disposed symmetrically with respect to medial plane 135. As will be appreciated, the superconducting coil assemblies 180 and 190 are used to create a primary, substantially constant magnetic flux in the frame, so as to provide a primary magnetic field in the scanning volume. Other magnetic flux sources, such as resistive (non-superconducting) coils and permanent magnets can be substituted for the superconducting coil assemblies.

In the scanning procedure, control means 112 and gradient excitation means 118 operate gradient coils 120 to provide relatively small magnetic fields varying in time in a known manner, and these magnetic fields are superimposed on the primary field created by the primary field magnet assembly 110 within the scanning volume 160. The control means 112 also cooperates with RF excitation means 114 and RF detection means 116 to apply appropriate radio frequency signals to that portion of the patient's body disposed within scanning volume 160 and to detect the resulting RF nuclear magnetic resonance signals from those portions. As well known to those skilled in the art of medical NMR imaging, appropriate mathematical processing is applied by control means 112 to relate the operation of the gradient coils and RF excitation means and the detected signals so as to create an image of the bodily structures located in scanning volume 160.

The magnetic flux generated by the flowing currents in coils 280 and 290 interacts with the frame 122. The polar regions carry high axially-directed magnetic fields, so that the magnetic flux passes between these regions and substantially parallel to polar axis 134. The axial connectors 140 and 142 and the columns 148 extending along the margins of the axial connectors form flux return paths extending parallel to the polar axis between the end pieces 124 and 130. These flux paths serve to carry the return lines of flux, i.e., the lines of flux extending counter-directionally to the flux between the polar regions. As will be appreciated, the coils 280 and 290 are substantially disposed within an enclosed shell defined by frame 122, and the flux generated by these coils is substantially confined to the interior of the shell and to within the shell walls. The flux outside of the frame is essentially zero. Because the field is essentially confined within the frame, disturbance outside the frame, as may be caused by moving metallic objects, will not appreciably affect the field within the frame, and particularly will not affect the field within the scanning volume 160. Because the field is confined in this fashion, magnetic materials outside of the device will not be attracted or propelled by the field and hence will not pose a safety hazard.

Figure 6:
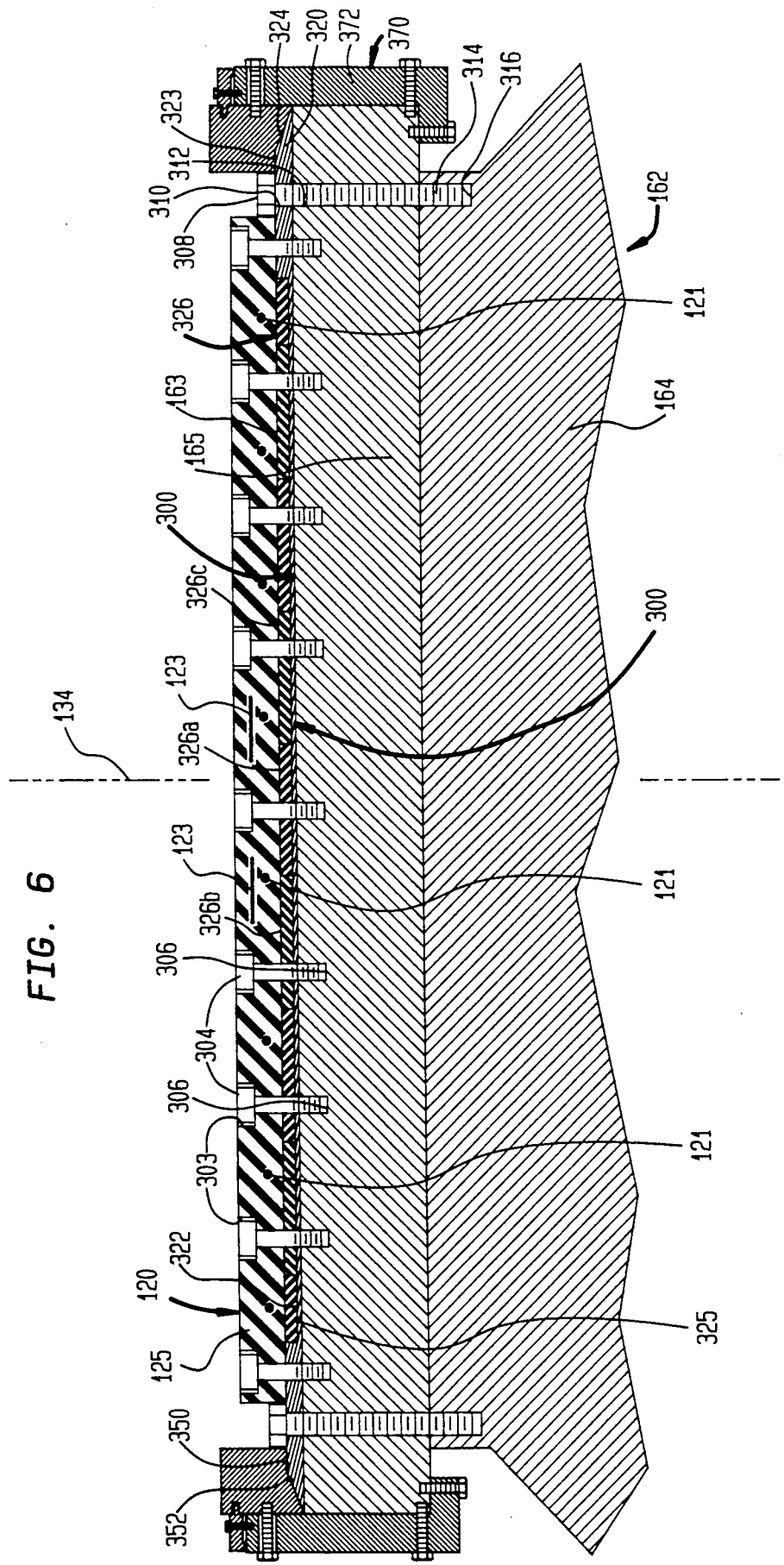
FIG. 6 is an enlarged sectional elevation view, taken along the line 6—6 of FIG. 2.

The gradient coils 120 are disposed within the primary field magnet assembly 110, along polar axis 134, on opposite sides of the patient-receiving space 158. Conventionally, two sets of gradient coils 120 are provided in each of the polar regions 170 and 172 to facilitate providing gradients in the magnetic field in two orthogonal directions that are perpendicular to each other and to the polar axis 134. A third set of gradient coils (not shown) is also conventionally installed so that the coils thereof lie on opposite sides of the polar axis and so that an axis connecting such coils is transverse to the polar axis. As best seen in FIG. 6, the lower set of gradient coils 120 incorporates a plurality of windings 121 extending generally parallel to one another in one direction transverse to polar axis 134 and a further plurality of windings 123, of which only one is partially visible in FIG. 6, extending generally perpendicular to conductors 121. Windings 121 and 123 are embedded in a non-conductive, non-magnetic material, which may be a polymeric resin such as an epoxy resin. The upper gradient coil 120 (FIG. 2) incorporates similar windings. The gradient coils 120 per se are conventional and, accordingly, need not be described in detail herein. However, in this embodiment of the present invention the gradient coils 120, and hence windings 121 and 123 are disposed adjacent patient space 158 and scanning volume 60, adjacent the lower and upper pole faces 163 and 169. As the gradient coils are energized by gradient coil excitation apparatus 118, electrical currents are directed through various ones of the windings 121 and 123 so as to generate magnetic field gradients within patient space 158. These currents also produce some magnetic flux directed away from the patient-receiving space, towards the pole facing pieces 165 and 168. As the currents through the windings 121 and 123 are varied to change the gradient within applied patient space 158, the flux directed toward the pole facing pieces also changes. Accordingly, the potential for eddy current generation in the pole facing pieces 165 and 168 exists during operation of the apparatus.

In order to limit the generation of eddy currents in the pole facing pieces 165 and 168, each of the pole pieces 162 and 166 is provided at the inboard end portion thereof (i.e., axially inwardly of the pole facing pieces 165 and 168) with a means, shown generally at 300 and 302, respectively, for limiting eddy current generation in the polar regions when the gradient producing means is energized. The eddy current limiting means 300 and 302 are essentially exact duplicates of one another and, accordingly, only the lower eddy current limiting means 300 will be described in detail, it being understood that a description of the upper eddy current limiting means 302 would be essentially the same as that set forth below for the lower eddy current limiting means.

Figure 5:
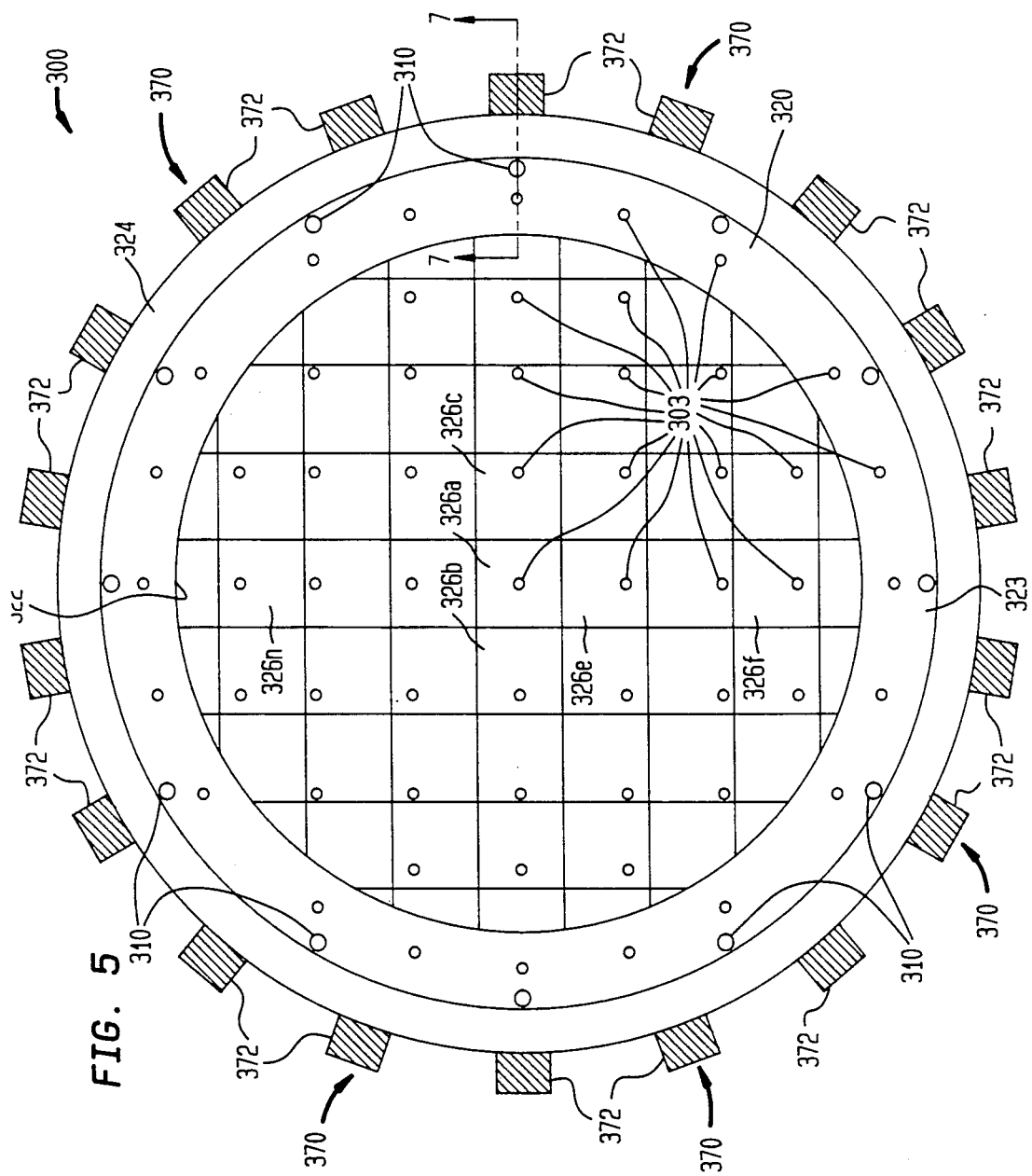
FIG. 5 is an enlarged plan view, taken along the line 5—5 of FIG. 2.
Figure 7:
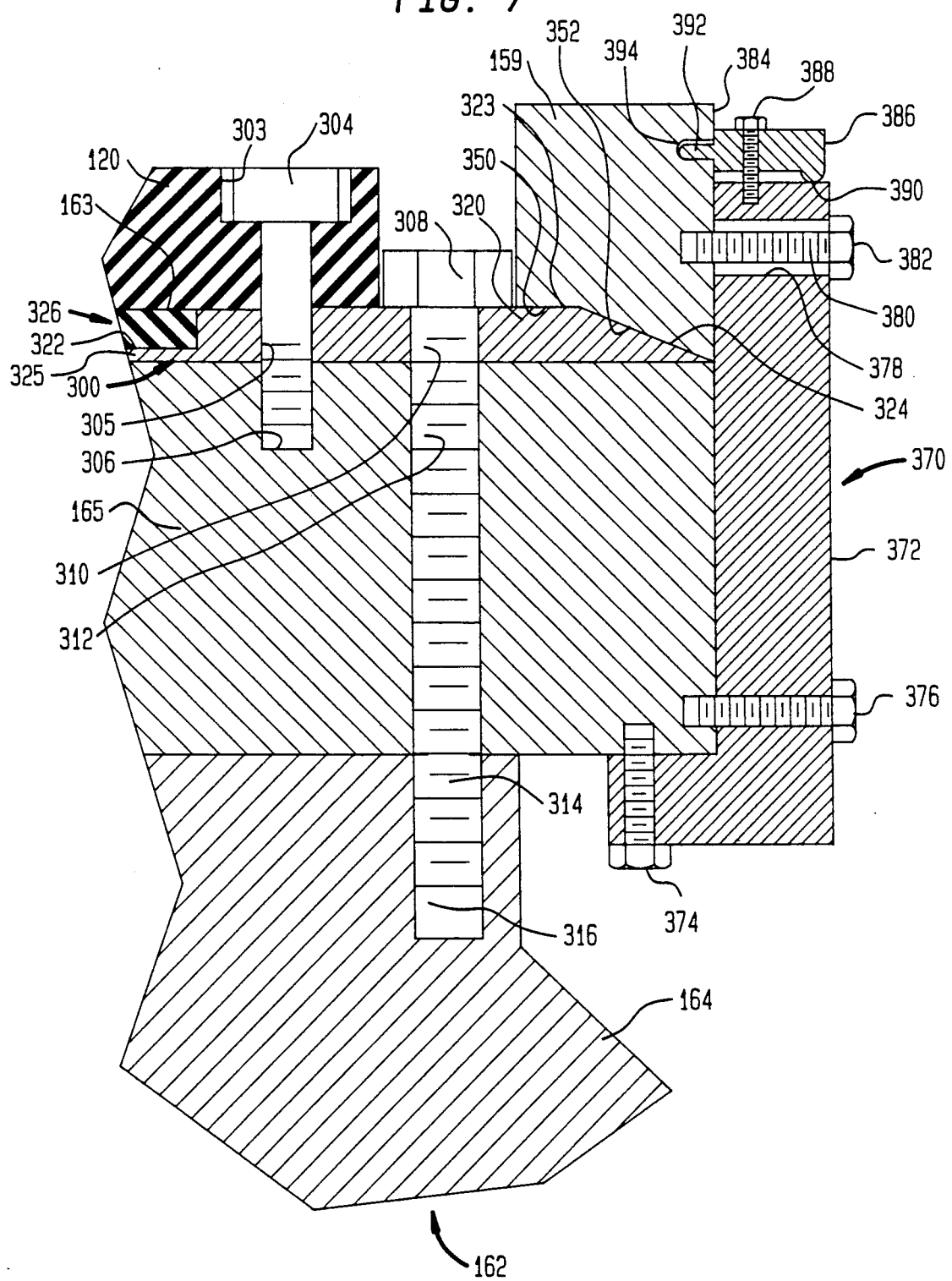
FIG. 7 is an enlarged fragmentary sectional elevation view, taken along the line 7—7 of FIG. 5.

Referring more particularly to FIGS. 5-7, the lower eddy current limiting means 300 is bolted to the inboard surface of the pole facing piece 165 by a plurality of brass or non-magnetic stainless steel bolts 304 which extend from recessed openings 303 in the gradient coil assembly 120, through apertures 305 in the eddy current limiting means 300, and are seated in threaded openings 306. Bolts 304 compact the assembly comprising the gradient coil 120, the eddy current limiting means 300 and the pole facing piece 165 together. A suitable electrically non-conductive adhesive material, for example an epoxy resin (not shown), is positioned between the inboard surface of pole facing piece 165 and the outboard surface of the eddy current limiting means 300 to electrically separate the two components as well as aid in fastening the two components to one another. In addition, a plurality of bolts 308 is employed to fasten the assembly comprising the eddy current limiting means 300 and pole facing piece 165 to the inboard end of the lower pole stem 164. The bolts 308 extend through openings 310 formed about the outer periphery of the inboard surface of eddy current limiting means 300, and through aligned apertures 312 in the adjacent pole facing piece 165. The bolts 308 are provided with threaded ends 314 which engage correspondingly threaded apertures 316 in the pole stem 164.

The eddy current limiting means 300 includes a multi-layer laminate 320 of ferromagnetic material, in which the various layers or planes of the laminate are arranged generally perpendicular to the polar axis 134 of the scanner. The various laminations of the laminate 320 are preferably made of electrical grade silicon steel which has been coated with, an electrically insulating material, for example an epoxy resin, prior to being assembled into the laminate 320. The multi-layer laminate 320 is provided with a recessed cylindrical portion 322 on its inboard surface, and is provided with an outer peripheral portion 323 that is chamfered, as shown at 324. One or more layers 325 of the laminate form the bottom of the recess 322.

The eddy current limiting means 300 also includes a generally planar, disk-shaped ferrite layer 326 that is positioned within and adhered to the surface of the layer 325 at the bottom of cylindrical recess 322. The ferrite layer 326 preferably includes a plurality of flat, generally rectangular ferrite elements therein, which have been identified at 326a, 326b. . . 326n. The thickness of the ferrite layer 326 corresponds to the depth of the cylindrical recess 322 in laminate 320 and the ferrite layer is adhered to laminate 320 by means of a bonding agent that is preferably electrically non-conductive. A suitable bonding agent is one made by Ablestick Laboratories of Gardena, Calif., and is identified by them as Product No. 550.

Although ferrite layer 326 is shown as being comprised of a plurality of generally rectangular ferrite elements 326a-326n, such arrangement is employed primarily to facilitate the manufacture of the ferrite layer. Thus, those of the ferrite elements that have similarly located openings 303 therein, for example ferrite elements 326b, 326c, 326d, 326e, 326f and 326n, can be fabricated as a group, according to the same specifications, and their orientations arranged when the layer 326 is assembled. Similar considerations apply to various of the other ferrite elements in the group of elements 326a-326n. The ferrite layer 326 could, alternatively, be manufactured as a single flat, cylindrical element, rather than from multiple rectangular elements.

The ferrite layer 326 is preferably comprised of a ferrimagnetic material having high electrical resistivity and high magnetic permeability. Among the ferrimagnetic materials that may be used in the eddy current limiting means 300 are those having spinel, garnet and hexagonal structures. A typical spinel ferrite is $NiFe_2O_4$. Other ferrites may be obtained by substituting magnetic (cobalt, nickel, manganese) or non-magnetic (aluminum, zinc, copper) ions for some of the nickel or iron ions, e.g., $Ni_{1-y}Co_yAl_xFe_{2-x}O_4$, where x and y may be varied to modify the magnetization (M) and the Curie Point ($T_c$) A typical garnet ferrimagnetic material is yttrium iron garnet (YIG), $Y_3Fe_5O_{12}$. This ferrimagnetic garnet combines very low magnetic loss with high resistivity. Substitution of magnetic rare-earth ions (gadolinium, ytterbium, holmium, etc.) for Y and of non-magnetic ions (gallium, aluminum) for some of the Fe ions leads to many different compositions with a wide range of magnetization M and magnetic loss. A typical hexagonal ferrite is $BaFe_{12}O_{19}$. Again, other magnetic ions, such as manganese, cobalt and nickel, may be introduced to produce wide variations in magnetization M and Curie Point $T_c$. Mixtures of the foregoing components may be employed.

The existence of ferrimagnetic materials capable of combining the resistivity of a good insulator (e.g., about $10^{12}$ Ohm-cm) with high permeability is well known. Practical values for the saturation magnetization M and Curie Point temperature $T_c$ range from 250–5,000 oersteds and from 100° to 600° C. The ferrites resemble ceramic materials in production processes and physical properties. The high resistance of ferrites make eddy-current losses very low since they have direct current resistivities that correspond to those of semiconductors, being at least one million times those of metals. In addition, magnetic permeabilities of ferrites may be as high as 5,000, and the dielectric constants of the ferrites are in excess of 100,000.

Preferably, the ferrite in ferrite layer 326 has the general formula $MeFe_2O_4$, wherein the term Me denotes a divalent cation which may be selected from the group comprising alkaline earth metals, nickel, cobalt and manganese. Alternatively, the ferrite may have the general formula $Me_3Fe_5O_{12}$, wherein the term Me denotes magnetic rare-earth ions selected from the group comprising gadolinium, holmium and ytterbium. As another alternative, the ferrite may have the general formula $MeFe_{12}O_{19}$, wherein the term Me denotes magnetic ions selected from the group comprising barium, cobalt, maganese and nickel. Here again, mixtures of the various components may be used.

Materials other than ferrites may also be employed. Thus, layer 326 may be formed from a wide variety of materials which combine the properties of relatively high magnetic permeability and low electrical resistivity. The material employed in the layer should have a magnetic permeability at low flux density ("initial magnetic permeability") of about 1,000 or more and desirably about 2,000 or more. Also, the material should have permeability at its maximum flux density ("maximum magnetic permeability") of about 1,000 or more, and desirably about 2,000 or more. Unless otherwise indicated, the term "magnetic permeability" as used in this disclosure refers to maximum permeability. Still higher values of initial and maximum permeability are desirable. Further, the material should have a relatively low coercive force, desirably below about 0.2 Oersted and preferably lower still. The material used in the layer should have a high maximum flux density, inasmuch as the magnetic flux constituting the primary field is directed through the layer in operation of the apparatus. The required maximum flux density depends upon the strength of the primary field to be used. Typically, the maximum flux density of the layer material should be about 4 kilogauss or more, preferably about 6 kilogauss or more, and desirably about 10 kilogauss or more. The volume electrical resistivity of the layer material desirably is about $10^{-3}$ ohm or more, more preferably at least about $10^{-3}$ ohm and most preferably at least about 10 ohm. Still higher values of resistivity are more desirable.

The electric and magnetic properties stated above should be understood as referring to the bulk properties of the material. As further discussed hereinbelow, certain useful materials are granular, particulate or composite, and hence may include individual grains, particles or phases which, considered in isolation, would not have these properties. However, the bulk properties of the material as a whole are significant here, rather than the properties of isolated particles, grains or phases.

The properties discussed herein should be understood as referring to properties measured at room temperature, i.e., about 20° C. Also, where the bulk magnetic properties are anisotropic, the values stated herein should be understood as applying to magnetic flux directed in the direction generally perpendicular to the layer.

The ferrites discussed above have these desired properties. However, any other material possessing these properties can also be employed. Ordinarily, solid metals have volume resistivity below about $10^{-3}$ ohm-cm and hence are not suitable. However, particulate metals, such as metals having particle sizes less than about 1 mm and typically less than about 0.1 mm have bulk resistivity considerably higher than the solid metals. Although a layer of loose, uncompacted powdered metal could be used, any such powdered metal most preferably is bonded into a unitary mass, as by compaction, sintering or other techniques which provide a partial fusion or interengagement of the individual particles with one another. A single such unitary mass may constitute the entire layer, or else several separate smaller masses may be used. The particulate metal layer may provide magnetic properties substantially equal to that of the metal in solid form. Numerous metals provide suitable magnetic properties. Among these are ferromagnetic alloys of one or more of iron, nickel, cobalt, chromium, molybdenum and copper. Suitable metals include those referred to by the trademarks 78 Permalloy, Supermalloy, Hypernik, Permenduo and 7-70 Perminver, and purified iron.

The layer may also incorporate a composite material including a particulate metal as discussed above. The particulate metal desirably is present in admixture with an electrically non-conductive material such as a polymeric material. The metal may constitute the major portion of the composite material by volume. Desirably, the metal particles constitute the disperse phase in the composite, such that each metal particle is substantially isolated from neighboring metal particles by the non-conductive material.

The layer of magnetically permeable, electrically resistive material 326 is thick enough that magnetic flux emanating from windings 121 and 123 passes back to the windings principally through the layer 326 rather than through pole facing piece 165 or through the laminate layer 325 underlying non-conductive layer 326. Thus, the magnetic reluctance along flux paths from the windings, through the layer in directions generally in the plane of the layer (and generally transverse to axis 134) and back to the windings should be less than the reluctance along flux paths from the windings, into the pole facing piece 165 and/or the underlying laminate layer 325.

The efficacy of eddy current suppression is directly related to the proportion of flux from the windings directed through the non-conductive layer rather than through the metallic, electrically conductive pole facing piece 165. The thickness of non-conductive layer 326 required to direct a given proportion of flux through the non-conductive layer will depend upon the magnetic permeability of the material in the layer, and the configuration of the windings. With typical windings and with materials as discussed above, the resistive layer should be at least about 7 mm thick, in order to assure that the major portion of the flux from the windings passes through the layer, thus substantially isolating the pole facing piece 165 from the windings. Still greater thickness is even more desirable.

The shim ring 159 is positioned inboard of the outer portion 323 of laminate 320. Shim ring 159 preferably includes an outboard surface 350 that includes a conical portion 352 thereof that corresponds to the chamfered portion 324 of laminate 320. The shim ring 159 is preferably an annular ring made of multiple spiral turns of an elongated thin layer of ferromagnetic material, but may have other configurations and be of other ferromagnetic materials such as solid iron or steel. Shim ring 159 is clamped in place inboard of the laminate 320 means of a plurality of clamping means, shown generally at 370, that are positioned at equiangularly spaced locations about the eddy current limiting means 300. Referring more particularly to FIG. 7, each of the clamping means 370 includes an L-shaped bracket member 372 that is bolted to the outboard face of pole facing piece 165 by a first bolt 374, and is bolted to a side edge of pole facing piece 165 by another bolt 376. The upper portion of bracket member 372 is provided with an enlarged opening or slot 378 that loosely receive the threaded shaft 380 of a bolt 382 that threadedly engages a side edge 384 of shim ring 159.

Clamping means 370 further includes a clamp member 386 that is positioned inboard of and is bolted by a bolt 388 to the inboard end of bracket member 372. The clamp member 386 is provided With a protrusion 390 that extends in an outboard direction from its outboard surface into engagement with the inboard end surface of bracket member 372. Protrusion 390 serves as a pivot point that allows clamp 386 to pivot relative to bracket member 372 when the bolt 388 is taken up or tightened relative to bracket 372. Clamp member 386 is further provided with a pin 392 that engages an aperture 394 in the side edge 384 of shim ring 159. The aperture 394 is slightly greater in diameter than pin 392 so that pin 392 may tilt relative to opening 394 in connection with clamping the shim ring 159.

In order to clamp shim ring 159 against the inboard surface of laminate 320, and thus assist in compacting the eddy current limiting means 300, the various bolts 382 are initially loosened slightly and then blots 388 are taken up sufficiently to cause the shim ring 159 to press against the inboard surface of laminate 320. When bolts 388 have been sufficiently taken up, bolts 382 are then tightened to lock the shim ring 159 in its clamping position. A similar procedure is employed in connection with assembling the shim ring 171 of the upper pole piece 162 (FIG. 2) to the upper eddy current limiting means 302.

Referring now to FIG. 2, it will be seen that the ferromagnetic frame 122 provides particularly effective flux concentration at the scanning volume 160 surrounding center point 137. Substantially all of the flux entering scanning volume 160 passes through the frame, and specifically through the pole pieces 162 and 166. The tapering configuration of the pole pieces 162, 166, and the shim rings 159 and 171, aid in shaping the "fringing" field remote from the polar axis, and hence aid in shaping the field in the scanning volume. Moreover, the ferrite layer 326 at each of the pole faces 163 and 169 inhibits the formation of eddy currents without appreciably interfering with the magnetic field, allowing the apparatus to provide good magnetic field uniformity, better than about one part in ten thousand.

As will be readily appreciated from the foregoing by those skilled in the art, various of the features described above can be varied significantly. Merely by way of example, the apparatus can be oriented differently, so that the polar axis extends horizontally, rather than vertically as shown. The eddy current limiting means and shim rings mentioned above are detachably mounted to the remainder of the frame, so that other eddy current limiting means and other shim rings can be substituted for the original ones. Also, the ferrite layers of the eddy current limiting means may be aligned at a high angle that varies slightly from being perpendicular to the polar axis, or they may have non-uniform or transverse distributions to provide the functions of shim rings.

The various lamination, ferrite layer and shim ring configurations hereinabove described can be selected to provide optimum field uniformity with coils 280 and 290 that are operated at either normal or lower than normal amperage. Thus, the primary field can be "tuned" or adjusted to different values, as desired. Other known shimming and field adjusting techniques can be applied in conjunction with the primary field magnet assemblies of the scanners described above to provide even more uniform fields. For example, supplemental coils can be added to the primary field magnet assembly. However, one particular advantage of the primary field magnet assemblies according to the present invention is that they can provide relatively good fields which can be used for medical NMR imaging, with only minimal adjustments in the use of these auxiliary devices. Stated another way, in devices according to preferred forms of the present invention, shimming and field adjustment techniques make a good field better, rather than raise a poor field to an acceptable level of uniformity.

Although the advantages of the present invention are realized well in the case of superconducting coils, the advantages of the invention can also be obtained with ordinary resistive coils, rather than superconducting coils as used in the embodiment described above. As those skilled in the art will appreciate, the number of ampere turns which can be accommodated in a non-superconducting coil is limited by considerations of heat evolution in the coil and the like. It is also apparent that the present invention is applicable also to primary field magnet assemblies which utilize permanent magnets, rather than superconducting coils or ordinary resistive coils.

In the embodiments discussed above, all of the components of the frame are substantially symmetrical about the polar axis and about the medial plane. However, this is not essential. Thus, the flux return path components need not be symmetrical about the polar axis. For example, the frame may be generally "C" shaped, with the tips of the C defining the poles and the polar axis, and with the flux return path extending on one side only of the polar axis. Also, the flux return path may be symmetrical but different from the configuration depicted above. Thus, a frame as depicted in said U.S. Pat. No. 4,675,609, or other frame configurations, may be employed. The configuration of the polar regions may differ substantially from that discussed above. Further, the electrically resistive, magnetically permeable layer may isolate the gradient windings from metallic components of the apparatus other than the frame. For example, where the primary field assembly includes superconducting coils having metallic housings and a gradient winding is disposed adjacent such a housing, a layer similar to that discussed above may be used to isolate the gradient winding from the metallic housing, and thus suppress eddy current generation in the housing incident to operation of the gradient winding.

As these and other variations and combinations of the features described above can be utilized without departing from the present invention as defined in the appended claims, the foregoing description of the preferred embodiment should be understood as being illustrative rather than as limiting the invention as defined in the claims.

What is claimed is

1. A medical NMR scanner comprising a primary field magnet assembly including:
   a) A frame defining a patient-receiving space adapted to receive a human body, said frame having a pair of opposed polar regions aligned on a polar axis and disposed on opposite sides of said patient-receiving space;
   b) means for producing a magnetic field within said patient-receiving space by passing magnetic flux into said patient-receiving space at least partially through said polar regions;
   c) means including at least one winding positioned in proximity to each of such polar regions for producing gradients in said magnetic field when energized; and,
   d) means including a layer of a magnetically permeable, electrically resistive material positioned in each of said polar regions, generally perpendicular to said polar axis, for conducting magnetic flux from said polar regions toward said patient receiving space while limiting eddy current generation in said polar regions when said gradient producing means is energized.

2. A scanner as claimed in claim 1, wherein said frame includes a metallic element and said layer is disposed between said at least one winding and said metallic element.

3. A scanner as claimed in claim 2, wherein said frame includes a pair of ferromagnetic pole pieces, each of said pole pieces extending substantially along said polar axis toward the other of said pole pieces, said pole pieces defining said polar regions.

4. A scanner as claimed in claim 3, wherein each of said pole pieces includes an inboard end portion adjacent said patient receiving space, and wherein said layers of said eddy current limiting means are carried by said inboard end portions of said pole pieces.

5. A scanner as claimed in claim 1, wherein said material has a maximum magnetic permeability of at least about 1,000 and a volume electrical resistivity of at least about $10^{-3}$ ohm-cm.

6. A scanner as claimed in claim 5, wherein said material has a volume electrical resistivity of at least about $10^{-2}$ ohm-cm.

7. A scanner as claimed in claim 6, wherein said material has a volume electrical resistivity of at least about 10 ohm-cm.

8. A scanner as claimed in claim 1, wherein said material is selected from the group consisting of ferrites, bonded particulate metals, unbonded particulate metals, composites incorporating particulate metals and combinations thereof.

9. A scanner as claimed in claim 8, wherein said material includes a ferrite.

10. A scanner as claimed in claim 9, wherein said material consists essentially of a ferrite.

11. A scanner as claimed in claim 10, wherein said ferrite has the general formula $MeFe_2O_4$, and wherein the term Me denotes a divalent cation.

12. A scanner as claimed in claim 11, wherein said divalent cation is selected from the group comprising alkaline earth metals, nickel, cobalt and manganese and mixtures thereof.

13. A scanner as claimed in claim 10, wherein said ferrite has the general formula $Me_3Fe_5O_{12}$, and wherein the term Me denotes an ion selected from the group comprising gadolinium, holmium, ytterbium and mixtures thereof.

14. A scanner as claimed in claim 10, wherein said ferrite has the general formula $MeFe_{12}O_{19}$, and wherein the term Me denotes an ion selected from the group comprising barium, cobalt, manganese, nickel and mixtures thereof.

15. A scanner as claimed in claim 8, wherein said material includes a bonded particulate ferromagnetic metal.

16. A scanner as claimed in claim 15, wherein said bonded particulate metal is a sintered metal.

17. A scanner as claimed in claim 8, wherein said material includes a composite incorporating a ferromagnetic particulate metal and a non-conductive material.

18. A scanner as claimed in claim 4, wherein said layers are generally planar and disk-shaped in form.

19. A scanner as claimed in claim 18, wherein each of said layers includes an inboard end and an outboard end, and wherein said outboard ends of said layers are positioned in contact with said inboard ends of said pole pieces.

20. A scanner as claimed in claim 18, further including a plurality of layers of ferromagnetic laminations carried by each of said pole pieces and positioned intermediate said inboard end portion thereof and said layer of magnetically permeable, electrically resistive material, said ferromagnetic laminations being oriented generally perpendicular to said polar axis.

21. A scanner as claimed in claim 20, wherein said layer of magnetically permeable, electrically resistive material is adhesively bonded to said ferromagnetic laminations by an electrically non-conductive adhesive material.

22. A scanner as claimed in claim 21, wherein said layers of magnetically permeable, electrically resistive material are generally planar and disk-shaped in form, and wherein said ferromagnetic laminations include recessed cylindrical portions which receive said layers therein.

23. A scanner as claimed in claim 22 wherein said frame comprises a ferromagnetic frame having a substantially continuous ferromagnetic flux return path extending between said polar regions remote from said patient-receiving space.

24. A scanner as claimed in claim 23, wherein said magnetic field producing means includes primary windings encircling each of said pole pieces.

25. A scanner as claimed in claim 23, wherein said magnetic field producing means includes a permanent magnet positioned in each of said pole pieces.

26. A scanner as claimed in claim 23, wherein said electrically non-conductive adhesive material comprises an epoxy resin.

27. A scanner as claimed in claim 23, wherein said adhesively bonded ferromagnetic laminations and said layer in each of said polar regions form respective composite cylindrical disks, and further including means carried by each of said pole pieces and in engagement with the inboard ends of corresponding ones of said disks for holding the outboard ends of said disks in position adjacent to the inboard ends of said pole pieces.

* * * * *